(12) United States Patent
Kokubo et al.

(10) Patent No.: US 6,287,636 B1
(45) Date of Patent: Sep. 11, 2001

(54) COATING APPARATUS AND METHOD UTILIZING A DILUENT AND A METHOD FOR PRODUCING A COLOR FILTER SUBSTRATE

(75) Inventors: Satoshi Kokubo; Nagato Osano, both of Kawasaki; Junichi Sakamoto, Yokohama; Kenichi Iwata, Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,270

(22) Filed: Nov. 23, 1999

(30) Foreign Application Priority Data

Nov. 25, 1998 (JP) .................................................. 10-333710
Nov. 25, 1998 (JP) .................................................. 10-333711

(51) Int. Cl.[7] ........................................................ B05D 1/36
(52) U.S. Cl. ........................... 427/356; 427/402; 427/164; 427/165; 359/885
(58) Field of Search ................................... 427/162, 164, 427/165, 299, 402, 355, 356; 359/885

(56) References Cited

U.S. PATENT DOCUMENTS

| | | |
|---|---|---|
| 2,761,791 | 9/1956 | Russell . |
| 4,001,024 * | 1/1977 | Dittman et al. .................. 96/87 R |
| 4,230,793 | 10/1980 | Losert et al. ..................... 430/315 |
| 4,696,885 | 9/1987 | Vijan ................................ 430/311 |
| 5,525,376 * | 6/1996 | Leonard ............................ 427/466 |
| 5,733,608 * | 3/1998 | Kessel et al. ..................... 427/547 |
| 5,861,195 * | 1/1999 | Bhave et al. ..................... 427/402 |
| 6,139,639 * | 10/2000 | Kitamura et al. ................ 118/680 |

FOREIGN PATENT DOCUMENTS

| | | |
|---|---|---|
| 57099367-A * | 6/1982 | (JP) . |
| 04100570-A * | 4/1992 | (JP) . |
| 5-11105 | 1/1993 | (JP) . |
| 5-142407 | 6/1993 | (JP) . |
| 6-339656 | 12/1994 | (JP) . |
| 08173878-A * | 7/1996 | (JP) . |
| 8-229497 | 9/1996 | (JP) . |
| 09234414-A * | 9/1997 | (JP) . |

* cited by examiner

Primary Examiner—Shrive Beck
Assistant Examiner—Wesley Markham
(74) Attorney, Agent, or Firm—Fitzpatrick, Cella, Harper & Scinto

(57) ABSTRACT

A coating apparatus comprising a plurality of paint supply devices, a mouthpiece for dispensing a paint supplied from the paint supply devices, and a stage for holding a coated object. The mouthpiece comprises a plurality of outlet ports. Also, a coating method comprising relatively moving a mouthpiece and a coated object to coat the coated object with paint in which a diluent is added to the paint to form a paint/diluent mixture upon the start of the coating process. This paint/diluent mixture is used to coat the coated object upon the start of the coating process and until the process reaches a steady state. The flow of diluent is then stopped and the coating process is continued using only the paint in a steady state coating process. The flow of diluent is then started again to form a paint/diluent mixture as the coating process ends. A coating with a highly uniform thickness along the entire length of the coated object is produced by this method.

6 Claims, 17 Drawing Sheets

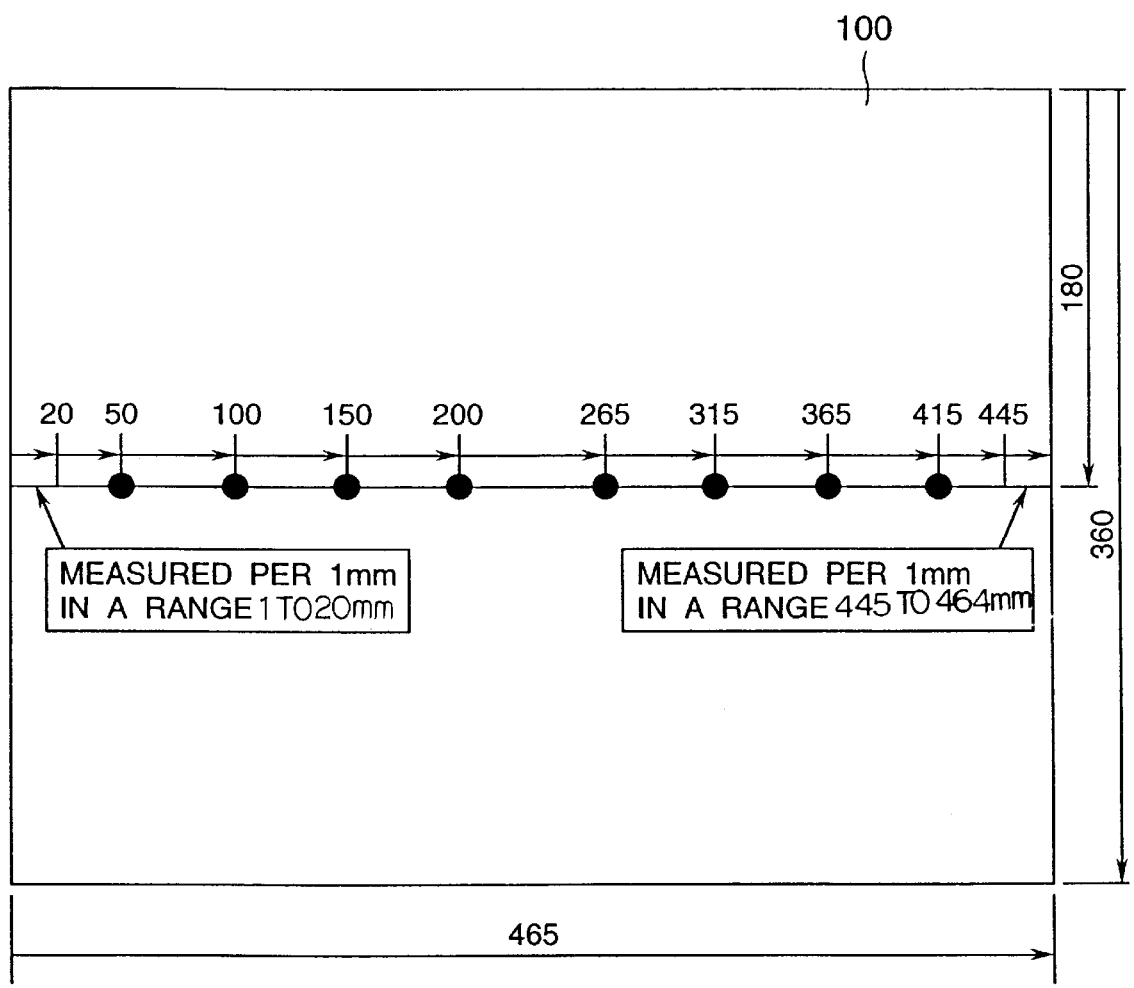

COATING APPARATUS AND METHOD UTILIZING A DILUENT AND A METHOD FOR PRODUCING A COLOR FILTER SUBSTRATE

BACKGROUND OF THE INVENTION

1. Field of the Invention

The present invention relates to a coating apparatus for coating a surface of each of objects to be coated, which are supplied one by one, with a liquid paint by a die coater, for example, in precision coating works such as coating of a resist in the field of fabrication of semiconductors, coating of an ultraviolet absorbing layer in the filed of fabrication of optical filters, and so on, a coating method, a method for producing a color filter substrate, and a liquid-crystal display apparatus using the color filter substrate produced by the method.

2. Related Background Art

There have been strong demands for the technology of thinly and uniformly coating small substrates having the length less than 1 m in the coating direction, such as plastic substrates for optical filters, glass substrates for liquid-crystal displays, glass substrates for color filters, and so on, with a variety of paints. For industrially forming a coating film on such substrates, a single-substrate coating method is employed; the objects to be coated (coated objects) are supplied one by one to a coater to be coated with a paint and be conveyed to the next step such as drying or the like.

Spin coaters, bar coaters, and roller coaters are commonly used for forming the coating film on the coated objects.

Among them, a method using the spin coater is a method widely used in coating of photoresist on semiconductor wafers, in which the coating film can be formed by dropping the paint onto the center of the surface of the rotating object to be coated. Thicknesses of coating films obtained by this method can be made uniform considerably accurately throughout the entire region of the coated object by selecting the paint from those of kinds suitable for this method. The method, however, requires an extremely large use amount of the paint in order to yield the coating film in the desired thickness and thus is not economical. In addition, the paint sometimes attaches to the edge and the back surface of the coated object and the paint scattered into the apparatus can be gelled or hardened therein, so as to degrade stability and cleanliness of steps, thus causing degradation of quality of coated products.

A method using the roller coater is a method for transferring the paint onto the coated object via a roller, which can be applied to coating of long coated objects and to coating of coated objects rolled in a roll form. However, since the paint is fed successively from a pan via the application roller onto the coated object in this method, the paint is exposed to air for a long period, so that the paint is apt to absorb moisture and deteriorate because of oxidization. In addition, mixing of foreign matter into the paint is also easy to occur. These will result in degrading the quality of coated products.

A method using the bar coater is a method for coating the coated object with the paint by use of a bar in which a thin wire is wound around a rod. This method has the disadvantage of stripes easily appear in the coating film, because the wire around the rod contacts the coated object.

Taking such disadvantages into consideration, a die coating method using the die coater has been proposed recently. Proposals of application of the die coater to the production of color filters are present in Japanese Patent Applications Laid-Open No. 5-11105, No. 5-142407, and No. 6-339656.

The die coaters have been adopted popularly heretofore in use of coating of thick films and continuous coating with high-viscosity paints, and coating methods known for forming the coating film on the coated object by the die coater include a curtain flow method, an extrusion method, a bead method, and so on, as described in U.S. Pat. Nos. 4,230,793, 4,696,885, and 2,761,791. Among them, the above bead method forms the coating film in such a manner that the paint is delivered through a slit provided in a mouthpiece of the die coater to form a paint mass called a paint bead between the mouthpiece and the coated object moving relative to the mouthpiece while maintaining a constant clearance thereto and that the paint is drawn out in this state with movement of the coated object to form the coating film. By adopting the bead method for continuously forming the coating film while supplying the same amount of paint through the slit as an amount of consumption for formation of the coating film, the uniformity of thickness can be accomplished with considerably high accuracy in the coating film thus formed. Since there is little waste of the paint and since a paint feed path is hermetically closed before the delivery through the slit, this method can prevent the deterioration of the paint and the mixing of foreign matter and can maintain the quality of resultant coating film high.

However, in cases wherein the die coater is employed for coating of a color layer in the production of the color filters for liquid-crystal displays, nonuniformity of thickness directly affects the quality in the form of nonuniformity of colors and also affects the gap of the liquid-crystal layer in coating of overcoat layer. There is thus the demand for coating of thin films with high uniformity of thickness.

An area that can be used as an effective region is a region in which the uniformity of thickness is within a fixed value. Since the die coating method is a discontinuous single-substrate coating method, it inevitably forms rises of nonuniform thicknesses at the coating start and end portions. For that reason, the effective region by the die coating method tends to become smaller because of the rises than that by the spin coating methods of the prior art.

The rises have the highest part at least 1.5 times greater than the average film thickness of the coating surface, and thus a problem can arise in steps after the coating step, for example, in development or the like of the photoresist after the coating in certain cases.

Methods for solving the problem of the above rises are normally methods of controlling the relative speed of the coated object to a paint dispensing device, a dispensing rate of paint (a dispensing amount per unit time), the distance (clearance) between the substrate and the tip of the mouthpiece of the paint dispensing device, and so on. Further, there are also suggestions to solve this problem by controlling the shape of the paint bead, as described in Japanese Patent Application Laid-Open No. 8-229497. However, where the film thickness is controlled during the period from the coating start to a steady coating state or during the period from the steady coating state to the coating end by controlling the above relative speed or dispensing rate, it is not easy to perfectly control behaviors of the paint bead varying instantaneously. When the thickness is adjusted by a method for decreasing the film thickness, it can induce a break of the paint bead and in turn degrade the stability of the coating step. From the viewpoint of the stability of the coating step, it is desirable to keep the volume of the paint bead at some large value.

Many films formed by coating in the production of color filters for liquid-crystal displays are thin films having the film thickness of not more than 10 μm in a dry state. For forming such thinner coating films, the volume of the paint bead becomes smaller. When the volume of the paint bead is small, the paint bead will be broken with failing to be retained continuously in the coating width direction unless sufficient adsorption force is obtained between the paint and the surface of the coated object. As a result, there will appear a defect of stripes in the coating film.

There is such a general tendency that the die coating methods have a narrower permissible range for surface energy than the spin coating methods. Therefore, the die coating methods are apt to cause a defect in the case of coating of a thinner coating film or in the case of coating with a paint of low surface energy.

SUMMARY OF THE INVENTION

An object of the present invention is to solve the above problems to provide a coating apparatus that can form a uniform and thin coating film with a wide effective region on a coated object in a good yield in the coating by the die coater, a coating method using the coating apparatus, a method for producing a color filter substrate, and a liquid-crystal display apparatus using the color filter substrate produced by the method.

A coating apparatus of the present invention comprises a plurality of paint supply devices, a mouthpiece for dispensing a paint supplied from the paint supply device, and a stage for holding a coated object, wherein the mouthpiece comprises a plurality of outlet ports.

Another coating apparatus of the present invention comprises a plurality of paint supply devices, a mouthpiece for dispensing a paint supplied from the paint supply device, and a stage for holding a coated object, wherein the mouthpiece comprises a plurality of supply paths against one outlet port.

Still another coating apparatus of the present invention comprises a plurality of paint supply devices, a mouthpiece for dispensing a paint supplied from the paint supply device, and a stage for holding a coated object, the coating apparatus comprising a plurality of such mouthpieces.

A coating method of the present invention is a method for moving a mouthpiece relative to a coated object to coat the coated object with a paint, the coating method comprising a step of mixing the paint with a diluent upon coating to change a concentration of solid matter in the paint.

Another coating method of the present invention is a method for moving a mouthpiece relative to a coated object to coat the coated object with a paint, the coating method comprising a step of coating the coated object with the paint after application of a treatment solution onto the coated object.

A method for producing a color filter substrate according to the present invention comprises a step of applying a photosensitive resin composition onto a substrate by the above coating apparatus, a step of forming a pattern in the photosensitive composition to form a black matrix pattern, and a step of dispensing color ink onto a space of the black matrix.

A liquid-crystal display apparatus of the present invention comprises the color filter substrate produced by the above production method, an opposed substrate placed opposite to the color filter substrate, and a liquid crystal composition sealed in between the color filter substrate and the opposed substrate.

BRIEF DESCRIPTION OF THE DRAWINGS

FIG. 17 is a plan view to show measuring points of film thickness in the present invention.

DETAILED DESCRIPTION OF THE PREFERRED EMBODIMENTS

The inventors focused attention on concentrations of solid matter in the paint in the coating step using the die coater and found out the fact that the film thickness of the coating film at the coating start and at the coating end was able to be controlled by sequentially controlling the concentrations of solid matter, thus accomplishing the present invention.

At the coating start by the die coating method, the paint bead 10 needs to be formed in a straight line pattern without a break across the coating width direction at the tip of the mouthpiece of the paint dispensing device. Therefore, a larger paint bead is formed at the coating start than in the steady coating state. This causes the coating film 8 to be formed in greater thickness at the coating start than in the steady coating state. Since the mouthpiece is moved away from the coated object at the coating end, part of the paint bead remains on the coated object as it is. The coating film in this part thus becomes thicker than the thickness of the steady coating part.

On the other hand, from the viewpoint of the stability of the coating step, it is desirable to suppress the thickening tendency of the film thickness of the coating film at the coating start and at the coating end without change in the delivery amount of the paint. For that purpose, the concentration of solid matter in the paint at the coating start and at the coating end is set lower than that in the steady coating part. Namely, the paint and the diluent for dilution thereof are supplied to the paint dispensing device to permit mixing thereof upon delivery, whereby the film thickness can be decreased by dispensing the paint in the lower concentration of solid matter at the coating start and at the coating end.

This control of the concentration of solid matter in the paint permits easier and more effective control of film thickness of the coating film 8 at the coating start and at the coating end than before, so as to decrease the height of the rises of the film surface and in turn expand the uniform thickness area.

Figure 1:
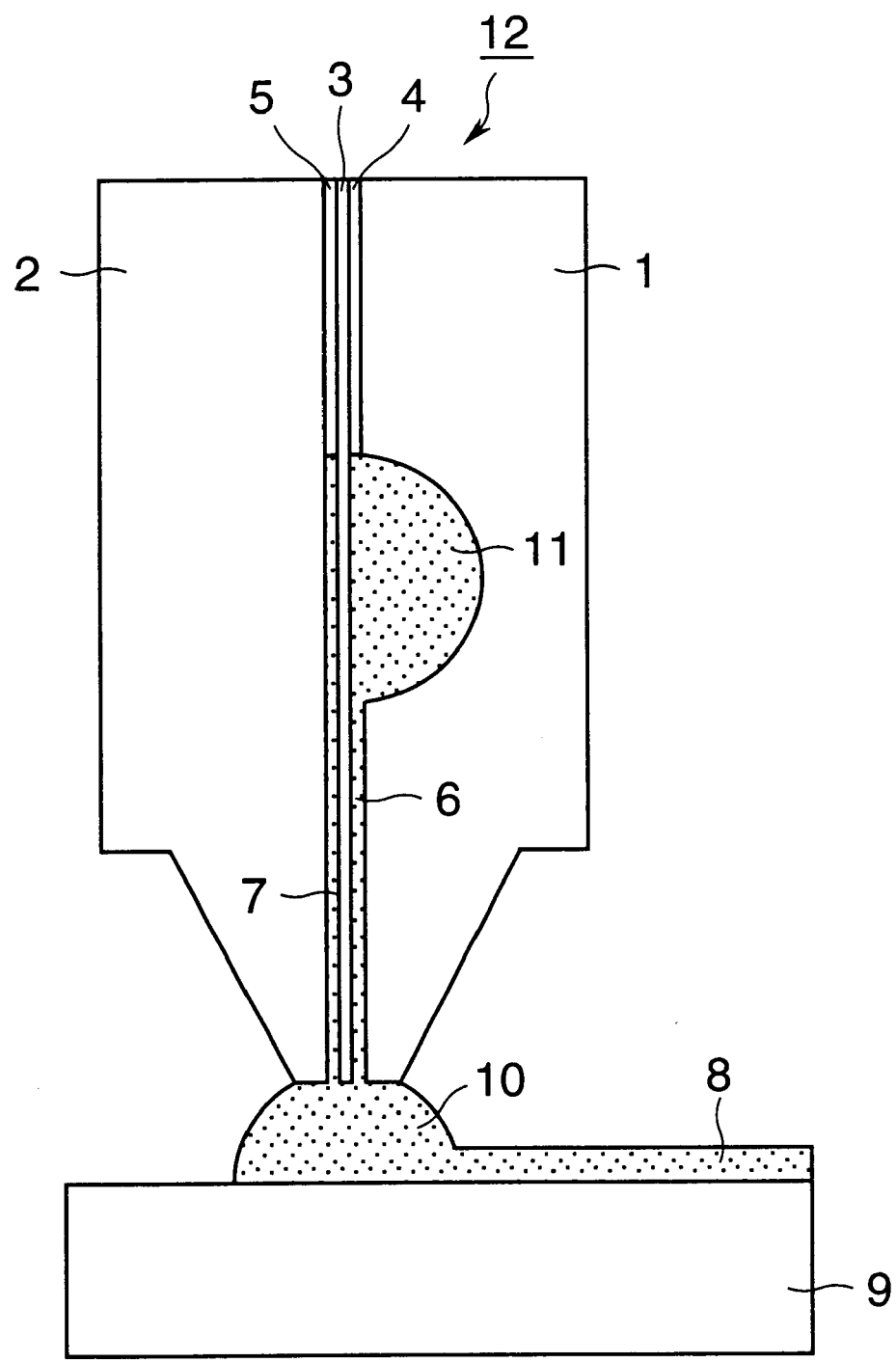
FIG. 1 is a sectional view to show a preferred example of the mouthpiece used in the coating apparatus of the present invention.

As illustrated in FIG. 1, the mouthpiece 12 comprised of front lip 1 and rear lip 2 is provided with a manifold 11 for uniformizing pressure distribution of the paint during a period of flow of the paint from a paint supply port (not illustrated) to a slit 6. The mouthpiece 12 is provided with outlet ports. Namely, a slit 7 is provided in addition to the slit 6. The paint is supplied from paint tank 25 to the mouthpiece 12 by fixed displacement pump 21. This fixed displacement pump 21 is a positive displacement pump such as a gear pump, a diaphragm pump, a syringe pump, or the like. Another paint supply means than the pumps can be one of a type in which the paint tank 25 is enclosed in a pressure vessel and in which pressure-increased air is supplied from a press pump to the pressure vessel to push the paint out. A filter 22 and a switching valve 23 are provided in a path of pipe 24 from the paint tank 25 to the fixed displacement pump 21 as occasion may demand.

On the other hand, the mouthpiece 12 is provided with the slit 7 through a partition 3 and a treatment solution is supplied to and dispensed through the slit 7. The treatment solution is, for example, a diluent for diluting the paint. In the present invention the diluent is, for example, a solvent component of the paint or a paint having a low concentration of solid matter. This diluent is supplied from a treatment solution tank 35 through a pipe 34 to the mouthpiece 12 by a fixed displacement pump 31, as the paint is. There are cases wherein a manifold is also provided in the supply path of the diluent to the slit 7 or cases wherein an injection port is formed directly in the wall surface of the slit. In FIG. 1, the diluent is supplied to the slit 7 in a state without provision of the manifold. This structure permits the paint and the diluent to be mixed at the tip of the mouthpiece 12, so as to enable to adjust the concentration of solid matter in the paint to be applied onto the painted object 9.

Figure 2:
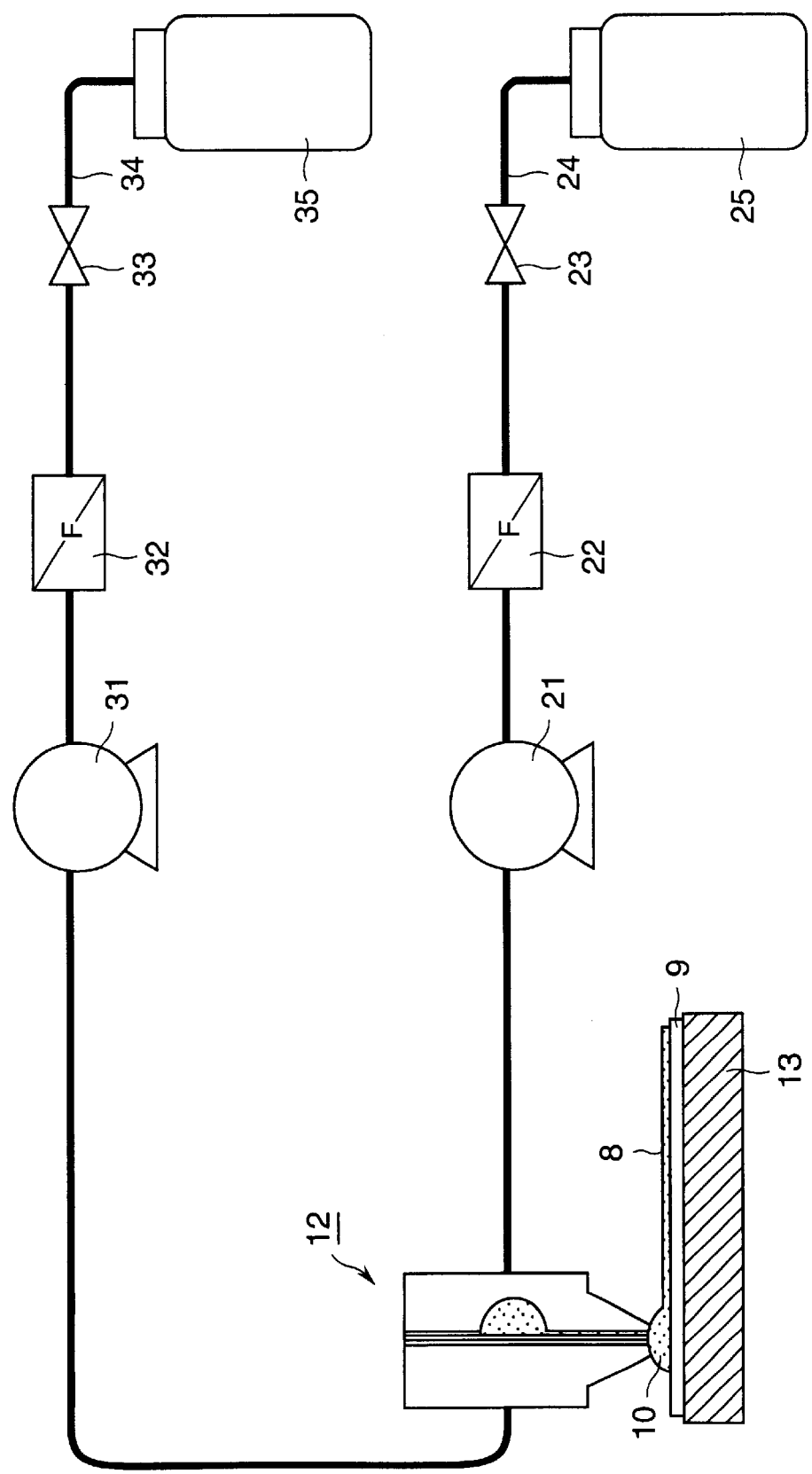
FIG. 2 is a schematic diagram to show an embodiment of the coating apparatus of the present invention.

The paint supply devices in the present invention mean the system from the paint tank 25 to the fixed displacement pump 21 and the system from the diluent tank 35 to the fixed displacement pump 31 in FIG. 2.

Figure 3:
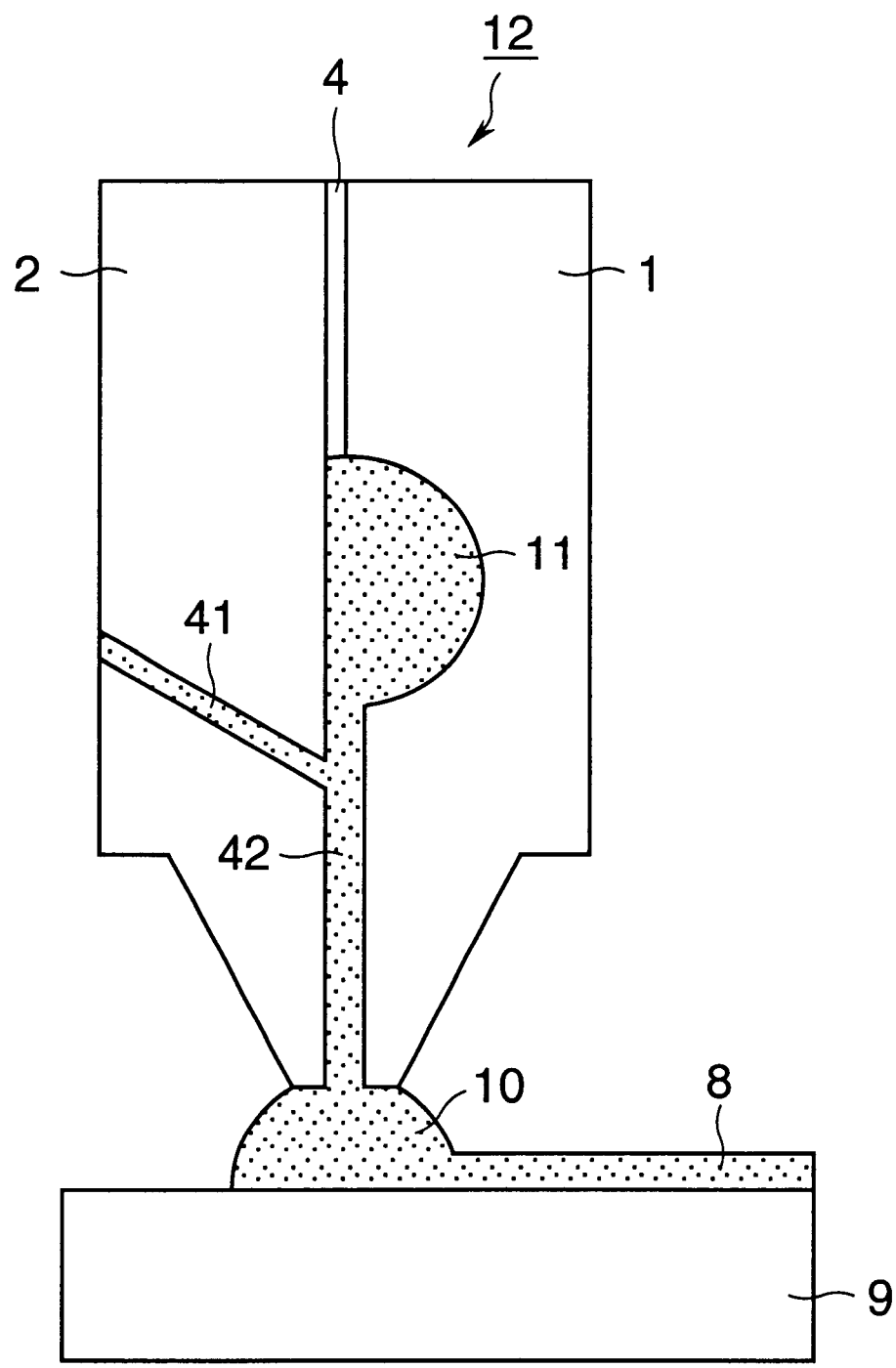
FIG. 3 is a sectional view to show another preferred example of the mouthpiece used in the coating apparatus of the present invention.

In the present invention, the mouthpiece 12 can also be constructed in the structure as illustrated in FIG. 3. In the case of this mouthpiece, the paint is supplied through the manifold 11 and a diluent supply path 41 is provided midway in the side wall of the slit 42. The diluent supplied through the diluent supply path 41 is mixed with the paint in the slit 42, and the paint in the low concentration of solid matter is dispensed through the slit 42.

In the step of coating the coated object with the paint by use of the single-substrate coating apparatus of the present invention, as illustrated in FIG. 2, the mouthpiece 12 is set relative to the coated object 9 through a constant gap (clearance). This clearance is preferably 20 to 500 $\mu$m. The slit gap of the mouthpiece 12 (the width in the coating direction of the slit 6 of FIG. 1 and the slit 42 of FIG. 3) is preferably 10 to 200 $\mu$m. The coated object 9 is mounted on a flat carrier stage 13 and is vacuum-sucked so as to prevent a shift thereof during the coating.

While the mouthpiece 12 or the carrier stage 13 is moved in parallel, the supply of the diluent is started from the fixed displacement pump 31 to the mouthpiece 12. When the relative movement distance between the mouthpiece 12 and the carrier stage 13 becomes, for example, 0 to 5 mm from the start of the supply of the diluent, the supply of the paint is started from the fixed displacement pump 21. It is better to adequately adjust an acceleration (an increase of dispensing rate per unit time) of the fixed displacement pump at the supply start of the paint according to the type of the paint, the application speed, the dispensing rate of the diluent, and so on. Further, when the relative movement distance between the mouthpiece 12 and the carrier stage 13 becomes, for example, 0 to 5 mm from the start of the supply of the paint, the supply of the diluent is stopped to enter the steady coating. During the steady coating period the coating is carried out with only the paint. On arrival at the position, for example, 0.1 to 5 mm before the coating end, the supply of the paint is terminated. Likewise, on arrival at the position, for example, 0.1 to 5 mm before the coating end, the supply of the diluent from the fixed displacement pump 31 is started. The supply stop of the paint and the supply start of the diluent are adjusted before or after depending upon the type of the coating solution, the desired thickness, the application speed, and so on. On arrival at the coating end, the movement of the mouthpiece 12 or the carrier stage 13 is terminated. The coating film is made in uniform thickness distribution by adjusting the substantial concentrations of solid matter in the paint at the coating start and at the coating end as described above.

The treatment solution supplied to the slit 7 may also be a liquid that modifies the surface of the coated object so as to decrease an angle of contact of the paint to the surface of the coated object. Namely, it is preferable to preliminarily apply or spray the treatment solution onto the surface of the coated object to increase the surface energy of the surface of the coated object to the paint. After this treatment, the coating can be carried out well by applying the paint by the die coater before the treatment solution dries. Such treatment solutions preferably applicable are N-methyl-2-pyrrolidone, propylene glycol monomethyl ether acetate, and so on. Use of such treatment solutions permits use of paints with high surface energy and enhances the stability of coating.

Figure 4:
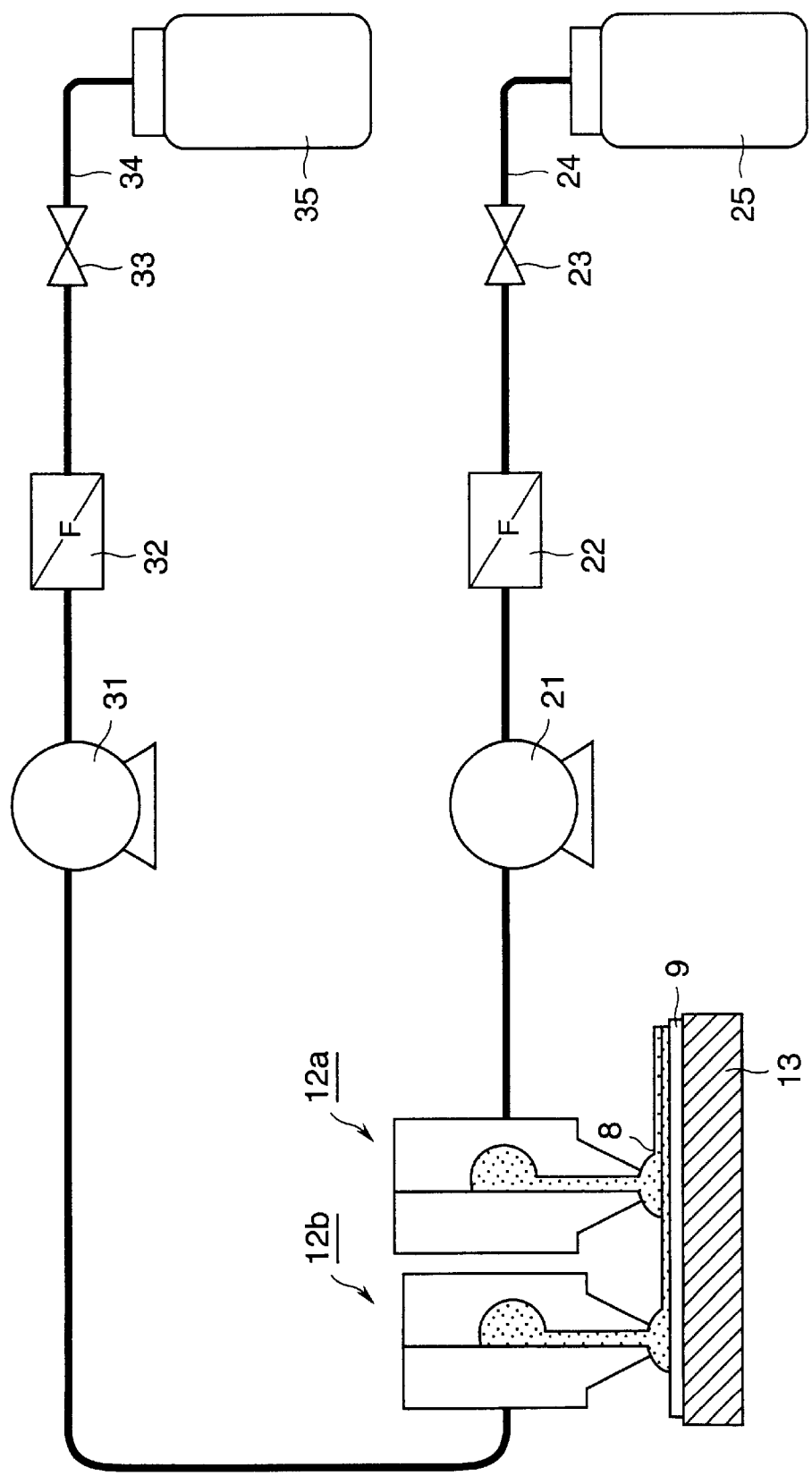
FIG. 4 is a schematic diagram to show another example of the coating apparatus of the present invention.
Figure 5A:
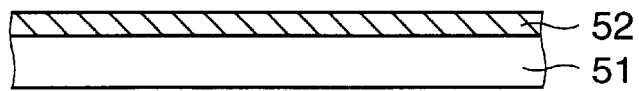
FIG. 5A, FIG. 5B, FIG. 5C, FIG. 5D, and FIG. 5E are step diagrams to show an example of the method for producing the color filter substrate according to the present invention.
Figure 5B:
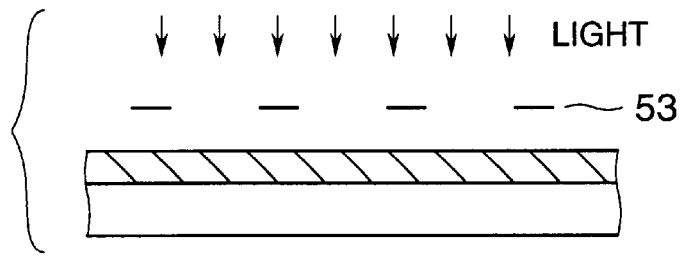
Figure 5C:
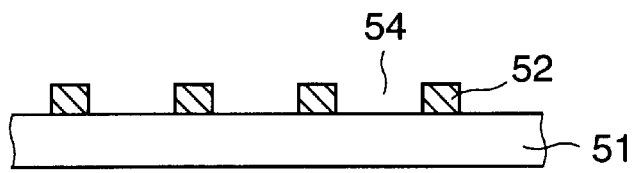
Figure 5D:
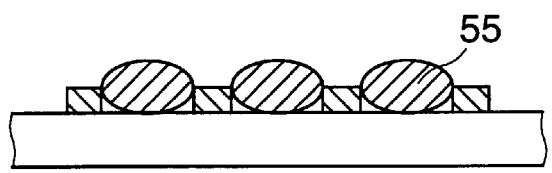
Figure 5E:
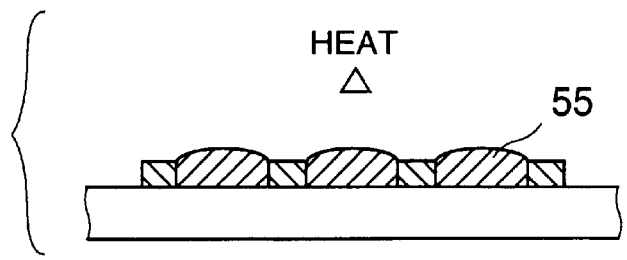

FIG. 4 shows an example of the coating apparatus provided with the mouthpiece 12a for the paint and the mouthpiece 12b for the treatment solution. In this apparatus the coated object 9 is conveyed by the carrier stage 13 whereupon the treatment solution is dispensed first through the mouthpiece 12b and the paint is dispensed then through the mouthpiece 12a onto the treatment solution. In this way the paint is applied onto the coated object after the surface thereof was modified by the treatment solution; therefore, the coating film is formed well. The preferred slit gap in this structure is the same as in FIG. 1, but the spacing between the mouthpieces 12a and 12b is desirably set so that the distance between the slits is approximately 5 to 200 mm.

In addition to the coating methods of the present invention using the apparatus of the above structures of FIG. 2 and FIG. 4, the coating method may also be modified so that the treatment solution is preliminarily applied or sprayed onto the coated object by the spin coating method or the spray coating method and thereafter the paint is applied onto the coated object by use of the coating apparatus provided with the mouthpiece for dispensing only the conventional paint.

The coating methods using the coating apparatus of the present invention are suitably applicable to the process for forming the color filter as a component of a liquid crystal device for color display. Normally, the color filter is produced by forming a shield layer of black metal or black resin called a black matrix or black stripes, a color layer having color pixels in opening portions of the shield layer, the color pixels being of the three primary colors of R (red), G (green), and B (blue), and a protective layer provided as occasion may demand, on a transparent substrate. When the coating apparatus of the present invention is applied to the coating of these shield layer, color layer, and protective layer or to the coating of resists used in patterning of the coating films, the coating films can be formed with a wide effective area and in uniform thickness, whereby good color filters can be formed in a high yield.

The color filter can be produced, for example, by a sequence of steps as illustrated in FIGS. 5A to 5E. FIGS. 5A to 5E correspond to the following steps (a) to (e).

(a) The transparent substrate 51 is coated with a black, photosensitive resin composition 52 by the coating apparatus of the present invention. The thickness of the coating film is one enough to achieve the required shield property, which is, for example, about 1 $\mu$m. The transparent substrate is often made, for example, of glass, but it may also be a plastic film or a plastic sheet. In order to enhance the adhesion of the transparent substrate to the black matrix and to the color ink, a thin film capable of enhancing the adhesion may also be preliminarily formed on the transparent substrate as occasion may demand.

(b) The coating layer is pre-cured, for example, using a hot plate or the like, and is then exposed using an exposure apparatus having the wavelength to which the photosensitive resin composition is sensitive, and using a mask 53 having a predetermined pattern.

(c) Development is then carried out. In the case of the negative type, portions shielded by the mask 53 during the exposure will be dissolved into a developer to expose the surface of the substrate and the exposed portions will remain as a black matrix pattern. Subsequent to it, the substrate is rinsed in order to wash the developer away and then is dried lightly by spin drying, air knife, or the like. After this, the substrate surfaces in spaces 54 of the black matrix become cleaned.

(d) Ink 55 of a predetermined color is dispensed onto the spaces 54 of the black matrix. An ink dispensing method can be selected from ordinary printing methods or the like such as offset printing, gravure printing, screen printing, and so on, but, particularly, an ink-jet printing method using an ink jet printer is preferably applicable, because it does not have to use a plate during printing and thus permits high-accuracy patterning only by control of the diameter of ink droplets. The ink used herein is one properly selected from ink materials which are apt to be repelled on the above black matrix pattern but are easy to wet the pixel portions in the spaces of the black matrix. The surface energy (surface tension) is normally 30 to 70 dyne/cm. Such ink may be either of the dye type or of the pigment type and a solvent thereof may contain a hydrophilic, organic solvent or the like in the matrix of water.

It is preferable to use thermosetting ink as the ink, because curing of the ink and final curing of the black matrix can be carried out in a common step.

A thermosetting component in the ink is preferably a material that can be cured under a temperature condition approximately equal to that for the final curing of the black matrix, and it can be selected from acrylic resin, epoxy resin, phenol resin, enthiol, and so on. It can also be selected from materials obtained by adding aromatic amine, acid anhydride, or the like to the above resins according to the process temperature required.

(e) A heating-drying operation (post bake) is carried out for the final curing of the black matrix, thereby forming the black matrix. It is preferable to also effect the final curing of the ink at the same time.

After that, the protective film is provided by the coating apparatus of the present invention as occasion may demand.

Figure 6:
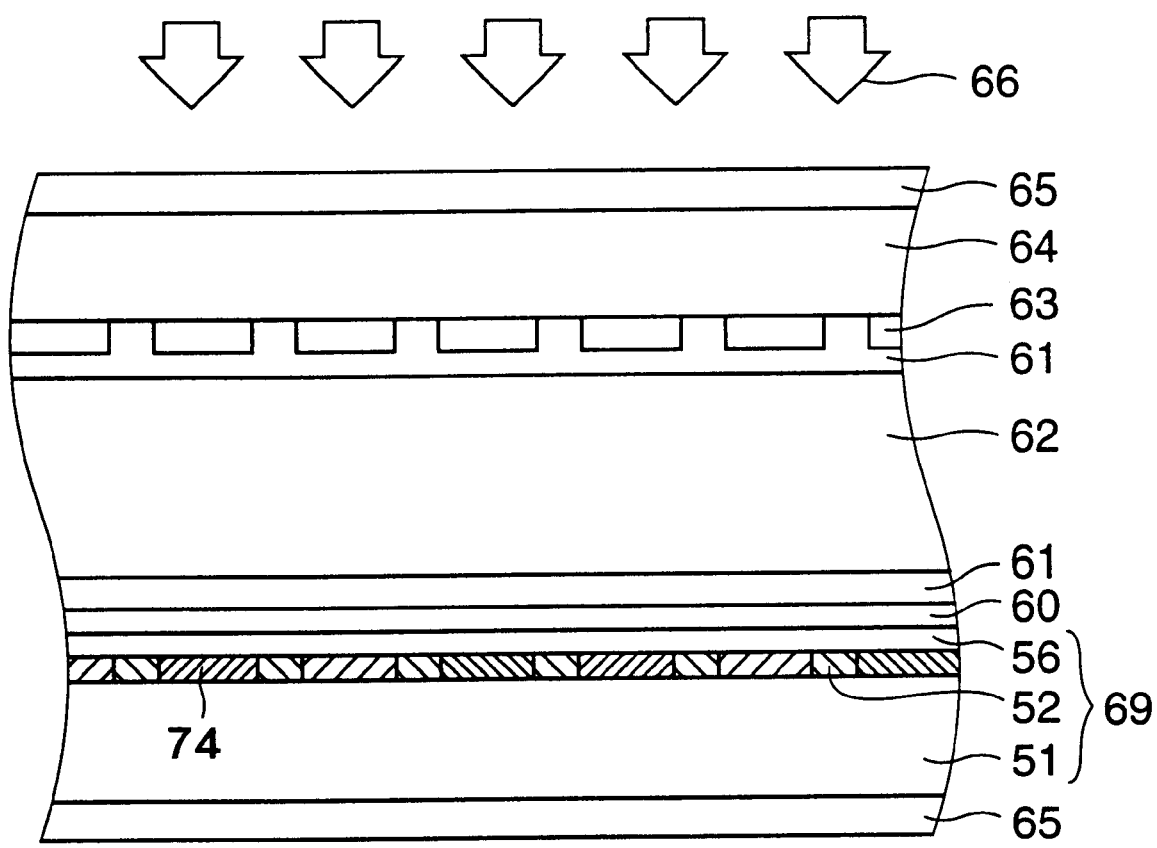
FIG. 6 is a sectional view to show an example of the liquid-crystal display apparatus of the present invention.

FIG. 6 shows a cross section of a TFT color liquid-crystal panel incorporating the color filter produced by the coating apparatus of the present invention. It should be noted here that the form of the panel is not limited to the present embodiment.

The color liquid-crystal panel is produced normally by aligning the color filter substrate 51 with an opposed substrate 64 and sealing a liquid-crystal composition 62 in between them. TFTs (not illustrated) and transparent pixel electrodes 63 are formed in a matrix on the internal surface of one substrate 64 of the liquid-crystal panel. On the internal surface of the other substrate 51, the color filter substrate 69 is laid so that the color materials 52 of R, G, and B are arranged at the positions opposite to the pixel electrodes, and a transparent, opposed electrode (common electrode) 60 is formed over the entire surface of the color filter substrate 69. The black matrix 74 is formed normally on the color filter substrate side. Further, alignment films 61 are provided on the inside surfaces of the both substrates, and liquid crystal molecules can be aligned in a certain direction by rubbing of the alignment films. A polarizing sheet 65 is bonded to the outside surface of each glass substrate and the liquid crystal compound 62 is filled in the space (about 2 to 5 $\mu$m) between these glass substrates. It is common practice to use a combination of a scattering plate (not illustrated) with a fluorescent lamp (not illustrated) as a source for back light 66. The liquid crystal compound works as an optical shutter for varying the transmittance of light from the back light, thereby effecting display. Reference numeral 56 denotes the protective layer formed if the case demands.

EXAMPLES

Example 1

The paint used herein was the photosensitive resin composition of the acrylic type in the following composition and coating was carried out using the coating apparatus provided with the paint dispensing unit having the mouthpiece in the structure of FIG. 1.

| | |
|---|---|
| Photosensitive resin composition terpolymer of the following composition | 10.0 parts by weight: |
| methyl methacrylate | 5.0 parts by weight |
| hydroxymethyl methacrylate | 3.0 parts by weight |

-continued

| | |
|---|---|
| N-methylolacrylamide | 2.0 parts by weight |
| triphenylsulfonium triflate ("TPS-105" available from Midori Kagaku) | 0.3 part by weight |
| ethyl cellosolve | 89.7 parts by weight |

The coated object was a non-alkaline glass substrate (Corning "1737") with the dimensions of 360 mm×465 mm×0.7 mm and the paint consisting of the above photosensitive resin composition was applied thereonto while setting the slit gap to 50 µm and the clearance to 75 µm. The fixed displacement pump used was the diaphragm pump and a high-precision servo motor was employed for driving the carrier stage.

The above paint was charged into the paint tank and the paint was preliminarily filled inside the feed path up to the mouthpiece. Ethyl cellosolve as a solvent component was charged into the treatment tank and this solvent was preliminarily filled inside the feed path up to the mouthpiece. The fixed displacement pump for feed of this solvent was the diaphragm pump.

Figure 7:
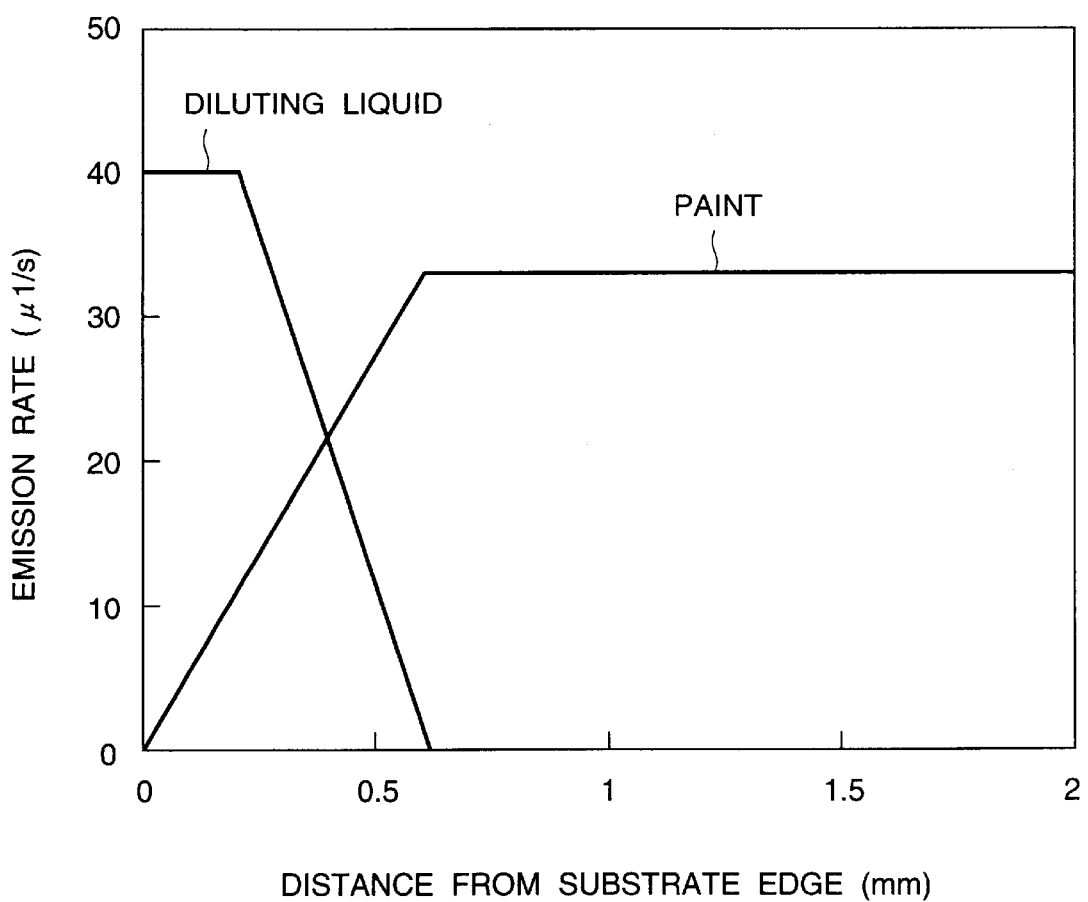
FIG. 7 is a diagram to show dispensing rates of the paint and diluent at the coating start in Example 1 of the present invention.
Figure 8:
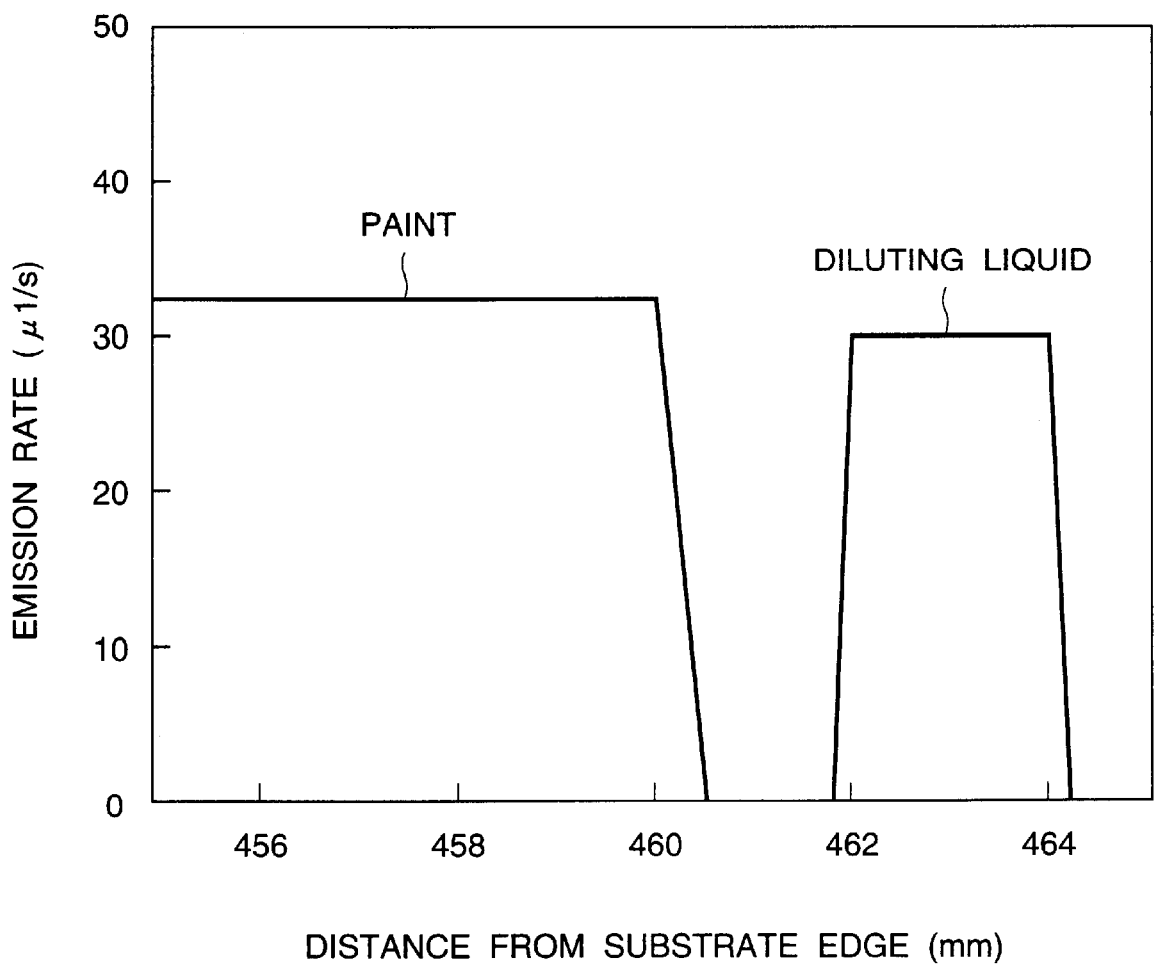
FIG. 8 is a diagram to show dispensing rates of the paint and diluent at the coating end in Example 1 of the present invention.

The substrate conveying speed was set to 12 mm/s, the dispensing rate of the paint to 32.8 µl/s in the steady coating part, and the maximum dispensing rate of the solvent to 40 µl/s. At the coating start the solvent and paint were dispensed at the dispensing rates as illustrated in FIG. 7, and at the coating end they were applied at the dispensing rates as illustrated in FIG. 8.

Figure 9:
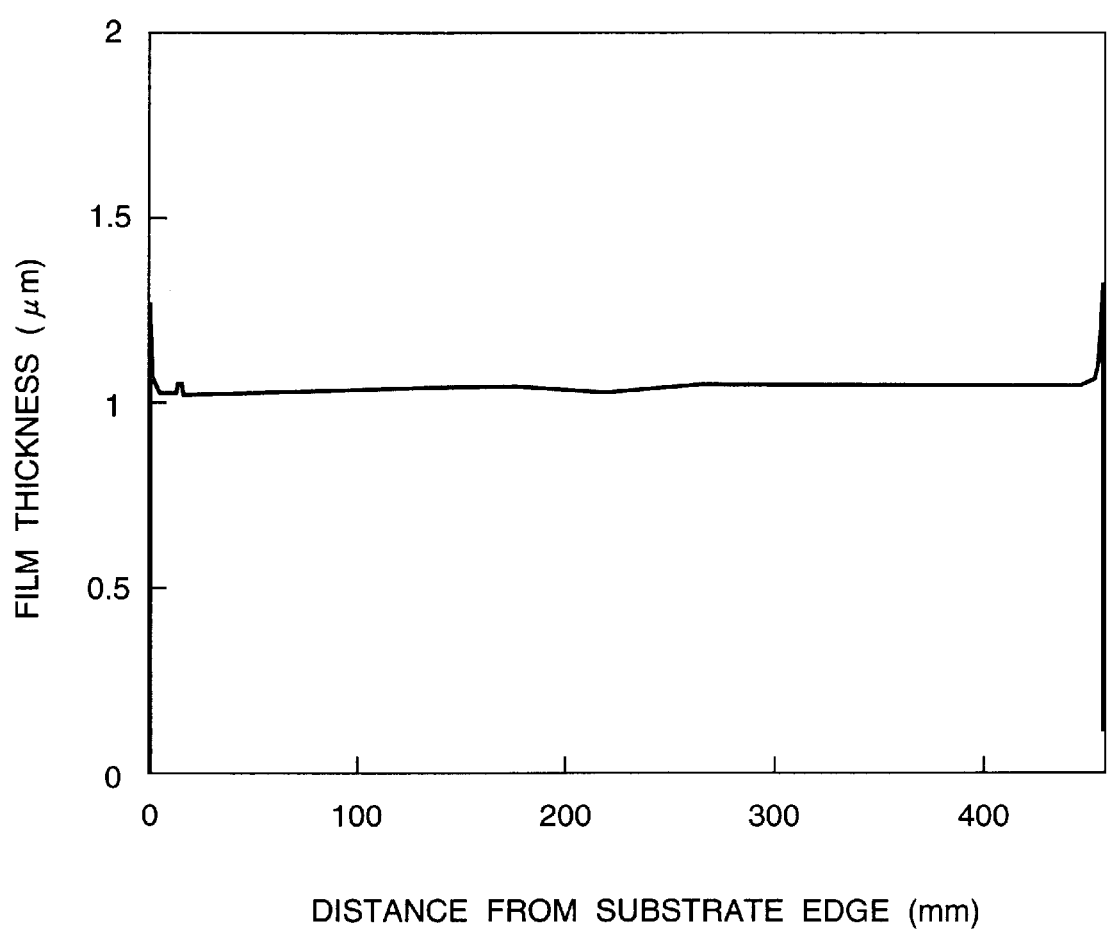
FIG. 9 is a diagram to show a film thickness distribution of the coating film in Example 1 of the present invention.

The coated substrate obtained was baked at 90° C. for twenty minutes by the hot plate to obtain the coating film. Film thicknesses in the coating direction were measured in the central part of the coating film obtained and the result was the thickness distribution as illustrated in FIG. 9. As shown in Table 1 below, the average thickness was 1.043 µm, the maximum thickness was 1.32 µm, the nonuniform area on the coating start side was 2 mm from the substrate edge, and the nonuniform area on the coating end side was 5 mm from the substrate edge, where the nonuniform area was defined as an area of thicknesses off the range of the average thickness ±5%. In the present invention the measurement of thicknesses was carried out as follows; the film surface was partly peeled off at measurement points on the coated substrate 100 illustrated in FIG. 17 and level differences were measured with a contact-type film thickness meter "FP-20" available from Tenkor Co. to obtain coating thicknesses at the respective points. In the edge regions of the substrate 51 the thicknesses were measured at intervals of 1 mm from the edge to 20 mm.

Example 2

The coating was carried out in the same manner as in Example 1, using the coated object, the paint, the diluent (solvent), the coating apparatus similar to those in Example 1, except for use of the mouthpiece in the structure of FIG. 3.

The coated substrate obtained was baked at 90° C. for twenty minutes by the hot plate to obtain the coating film. Film thicknesses in the coating direction were measured in the central part of the coating film obtained. As shown in Table 1 below, the average thickness was 1.064 µm, the maximum thickness was 1.40 µm, the nonuniform area on the coating start side was 5 mm from the substrate edge, and the nonuniform area on the coating end side was 5 mm from the substrate edge, where the nonuniform area was defined as an area of thicknesses off the range of the average thickness ±5%.

Example 3

The paint used was a color-coat-forming paint for color filter ("CR-7001" available from Fuji Film Olin Co.). This paint is a photosensitive resin having the viscosity of 12 cP and the solid content of 24.9 wt %. The diluent used was a solution obtained by adding the solvent to the above paint to the solid content of 12.0 wt %.

In the present example, the mouthpiece used was the one of the structure of FIG. 3, the paint tank and the treatment tank were enclosed in respective pressure canisters in the apparatus of FIG. 2, and each liquid was fed by increasing the pressure with nitrogen. The volume of the coating was the same as in Example 1, but the conditions were such that the clearance between the mouthpiece and the coated object was 50 µm, the substrate carrying speed was 20 mm/s, and the dispensing rate of the paint was 28.9 µl/s in the steady coating part. The diluent was fed under the pressure of nitrogen of 0.3 kgf/cm² and the dispensing rate upon opening of the switching valve was 28 µl/s.

Figure 10:
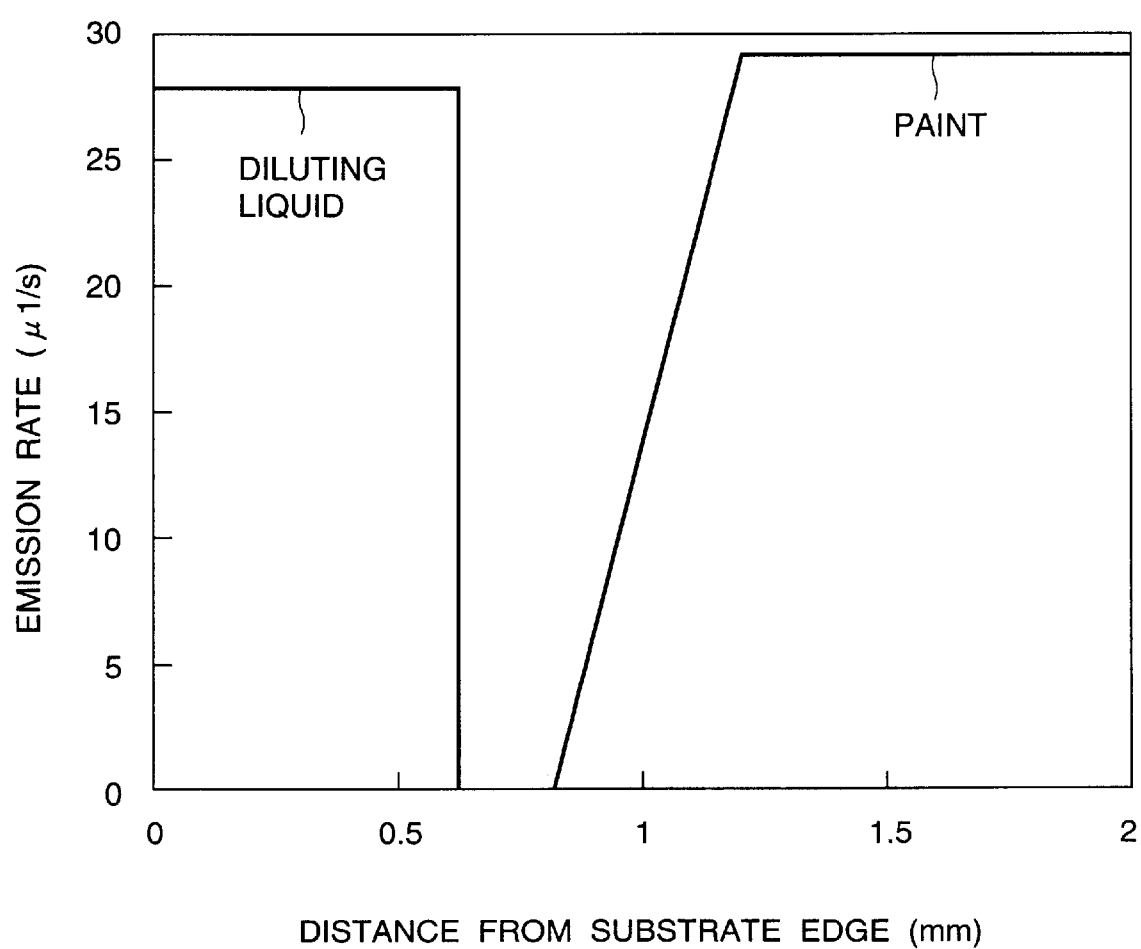
FIG. 10 is a diagram to show dispensing rates of the paint and diluent at the coating start in Example 3 of the present invention.
Figure 11:
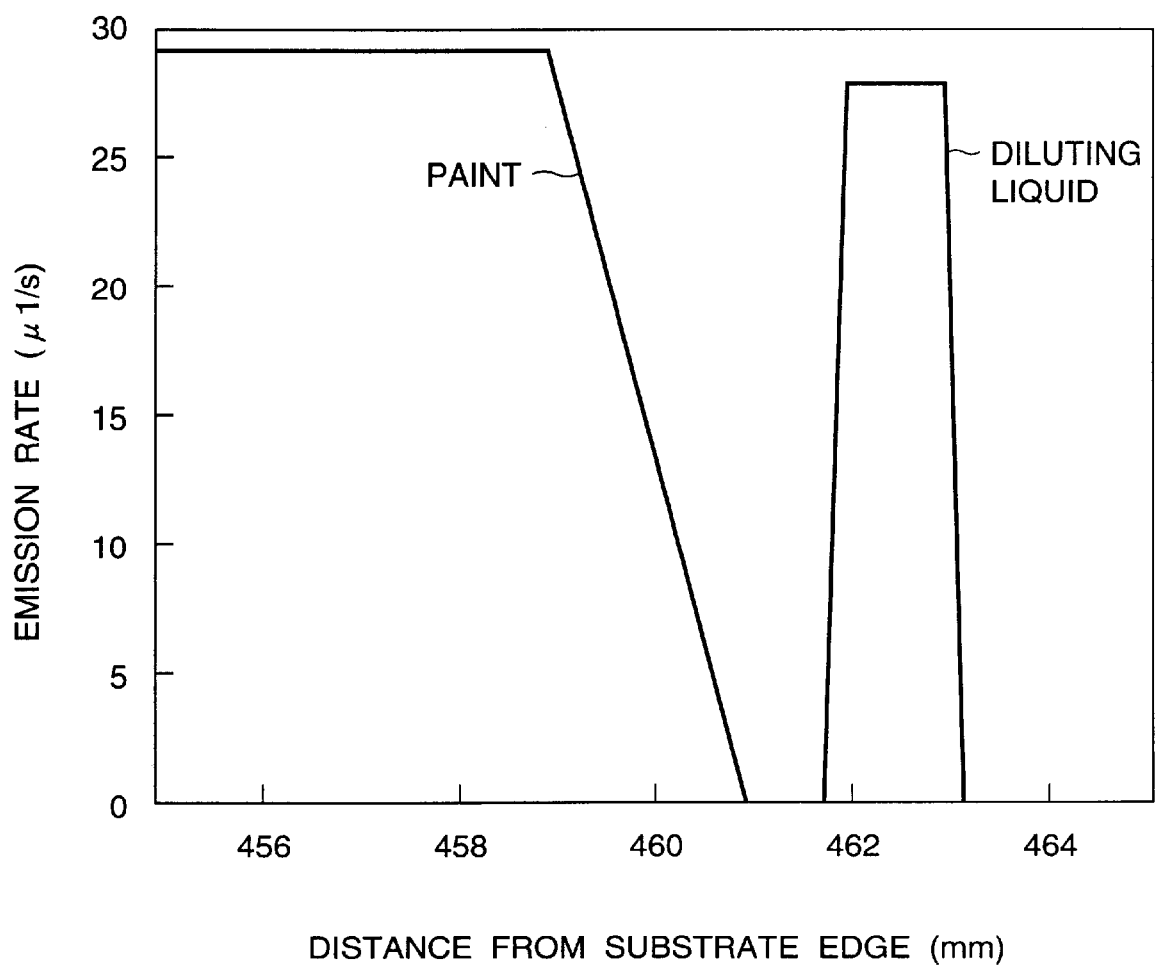
FIG. 11 is a diagram to show dispensing rates of the paint and diluent at the coating end in Example 3 of the present invention.

At the coating start the coating was carried out at the dispensing rates as illustrated in FIG. 10, and at the coating end the coating was carried out at the dispensing rates as illustrated in FIG. 11.

Figure 12:
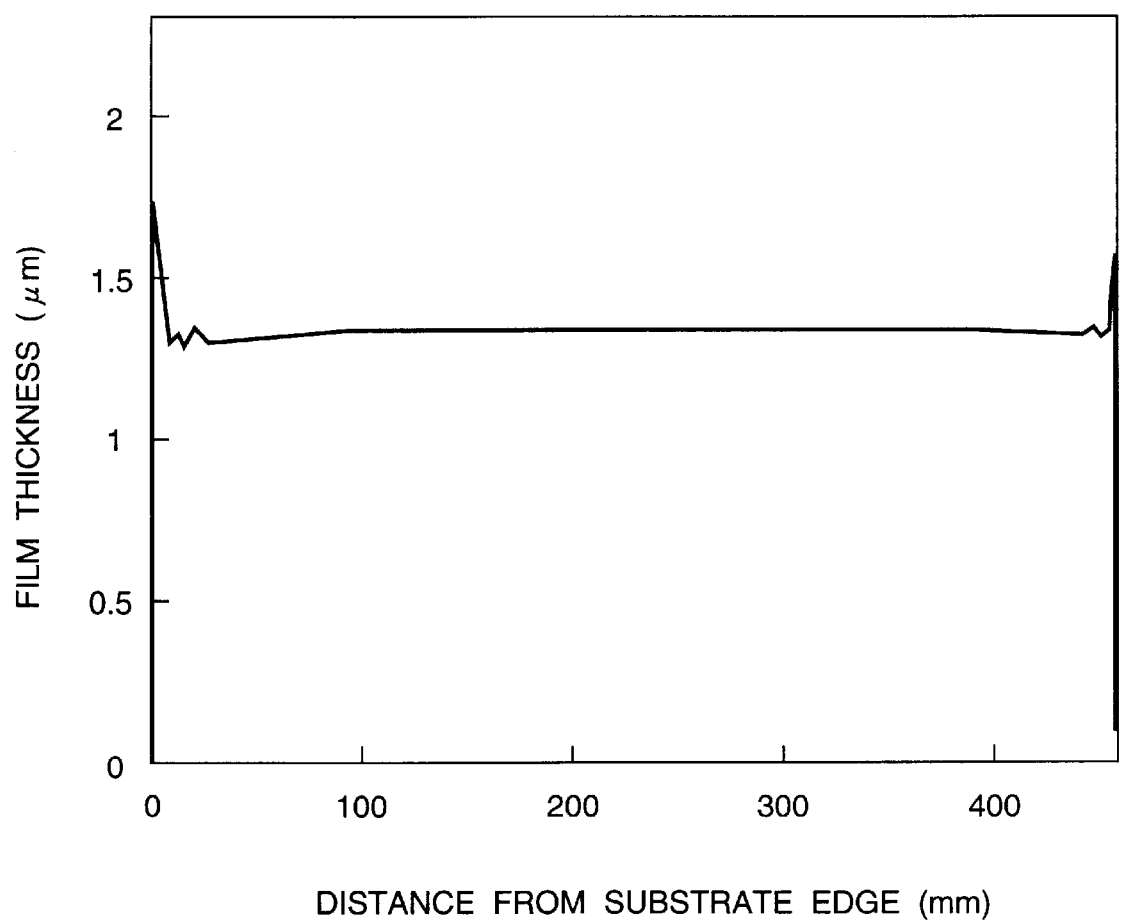
FIG. 12 is a diagram to show a film thickness distribution of the coating film in Example 3 of the present invention.

The coated substrate obtained was baked at 90° C. for five minutes by the hot plate to obtain the coating film. Film thicknesses in the coating direction were measured in the central part of the coating film obtained and the result was the thickness distribution as illustrated in FIG. 12. As shown in Table 1 below, the average thickness was 1.332 µm, the maximum thickness was 1.73 µm, the nonuniform area on the coating start side was 3.5 mm from the substrate edge, and the nonuniform area on the coating end side was 5 mm from the substrate edge, where the nonuniform area was defined as an area of thicknesses off the range of the average thickness ±5%.

Example 4

Using the glass substrate used in Example 1, the three-layer chromium black matrix was patterned, and with use of the paint used in Example 3, coating, baking, exposure, and development were carried out repeatedly thereon for each of the three colors of R, G, and B to obtain a color filter. The coating conditions were the same as in Example 3.

A liquid-crystal color display was constructed using the color filter obtained and it was able to display high-definition images.

Comparative Example 1

The coating was carried out in the same manner as in Example 1 except for use of the mouthpiece in the same structure as in FIG. 1 except that the mouthpiece did not have the slit 7 and the partition 3 for supply of diluent and except for use of the apparatus in the structure in which the diluent supply system (treatment tank 35, pipe 34, switching valve 33, filter 32, and fixed displacement pump 31) was excluded from the structure of the apparatus of FIG. 2. The coating was carried out at the fixed substrate carrying speed of 12 mm/s and at the fixed dispensing rate of the paint of 32.8 µl/s.

Figure 13:
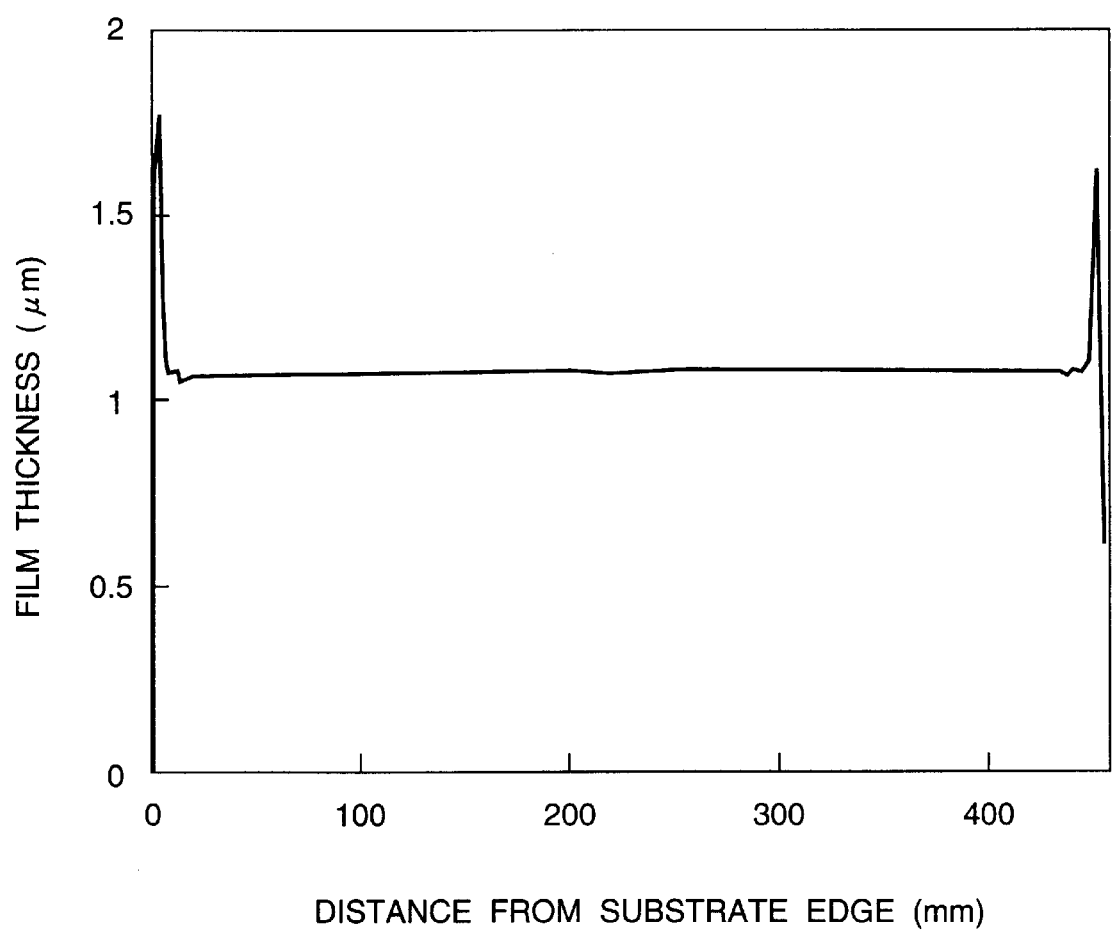
FIG. 13 is a diagram to show a film thickness distribution of the coating film in Comparative Example 1 to the present invention.

The coated substrate obtained was baked at 90° C. for twenty minutes by the hot plate to obtain the coating film. Film thicknesses in the coating direction were measured in the central part of the coating film obtained and the result was the thickness distribution as illustrated in FIG. 13. As shown in Table 1 below, the average thickness was 1.093

μm, the maximum thickness was 1.76 μm, the nonuniform area on the coating start side was 8 mm from the substrate edge, and the nonuniform area on the coating end side was 10 mm from the substrate edge, where the nonuniform area was defined as an area of thicknesses off the range of the average thickness ±5%.

Comparative Example 2

Figure 14:
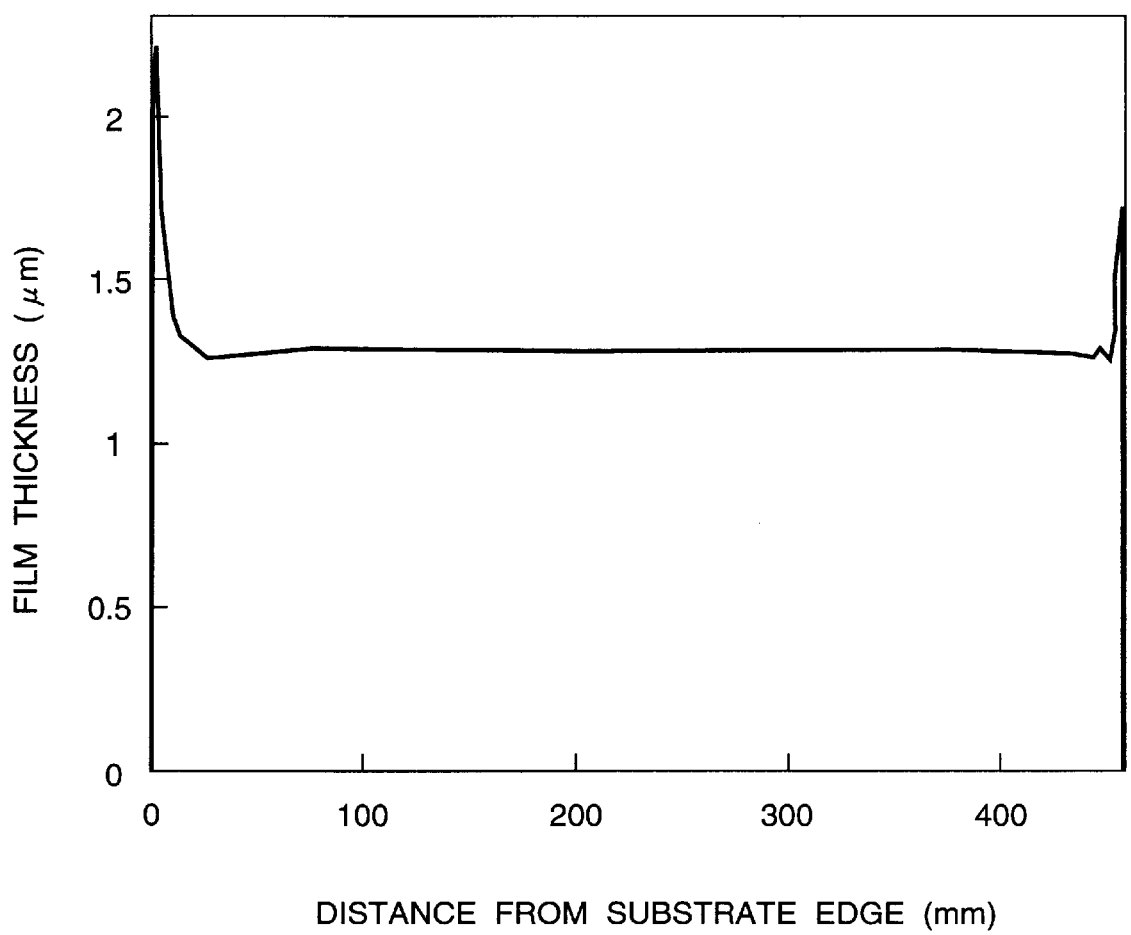
FIG. 14 is a diagram to show a film thickness distribution of the coating film in Comparative Example 2 to the present invention.

Using the mouthpiece used in Comparative Example 1, the coating was carried out in the same manner as in Example 3 except that the diluent was not used. The coated substrate obtained was baked at 90° C. for five minutes by the hot plate to obtain the coating film. Film thicknesses in the coating direction were measured in the central part of the coating film obtained and the result was the thickness distribution as illustrated in FIG. 14. As shown in Table 1 below, the average thickness was 1.294 μm, the maximum thickness was 2.20 μm, the nonuniform area on the coating start side was 14 mm from the substrate edge, and the nonuniform area on the coating end side was 5 mm from the substrate edge, where the nonuniform area was defined as an area of thicknesses off the range of the average thickness ±5%.

TABLE 1

|   | Average thickness (μm) | Max thickness (μm) | Nonuniform areas | |
|---|---|---|---|---|
|   |   |   | Coating start | Coating end |
| Ex 1 | 1.043 | 1.32 | 2 mm | 5 mm |
| Ex 2 | 1.064 | 1.40 | 5 mm | 5 mm |
| Ex 3 | 1.332 | 1.73 | 3.5 mm | 3 mm |
| Comp Ex 1 | 1.093 | 1.76 | 8 mm | 10 mm |
| Comp Ex 2 | 1.294 | 2.20 | 14 mm | 5 mm |

Example 5

The photosensitive resin composition consisting of the below acrylic polymer was applied onto the non-alkaline glass substrate 1737 (Corning) with the dimensions of 360 mm×465 mm×0.7 mm by the spinner. The application was carried out under such application conditions of the spinner that the retention time was ten seconds at 1000 rpm.

The substrate obtained was baked at 90° C. for twenty minutes by the hot plate. The film thus obtained had the thickness of 1.0 μm. terpolymer consisting of

| methyl methacrylate | 5.0 parts by weight |
|---|---|
| hydroxymethyl methacrylate | 3.0 parts by weight |
| N-methylolacrylamide | 2.0 parts by weight |
| triphenylsulfonium triflate ("TPS-105" available from Midori Kagaku) | 0.3 part by weight |
| ethyl cellosolve | 89.7 parts by weight |

This substrate as a coated object was coated using the coating apparatus of FIG. 2 provided with the paint dispensing device having the mouthpiece of the structure of FIG. 1. The paint used was a mixture in which an acrylic coat agent SS-6699G and a curing agent SS-0699G therefor available from JSR K. K. were mixed at the ratio of 26:9 by weight.

The treatment solution was ethyl cellosolve which was the solvent of the paint. The slit gap of the paint slit was set to 50 μm, the slit gap of the treatment slit to 20 μm, the distance between the slits to 100 μm, and the clearance to 75 μm. The fixed displacement pump for feed of the paint was the diaphragm pump, the treatment tank was set in a pressure canister to form the fixed displacement pump for feed of the treatment solution, and the pressure was increased by pressure air of 0.4 kg/cm². The high-precision servo motor was adopted for driving of the carrier stage.

The above paint was charged into the paint tank and the paint was preliminarily filled inside the feed path up to the mouthpiece. On the other hand, ethyl cellosolve was charged into the treatment tank and this solvent was preliminarily filled inside the feed path up to the mouthpiece.

The coating width was set to 355 mm and the substrate carrying speed to 12 mm/s. Then discharge of the treatment solution and the paint was started from the position 2 mm apart from the edge of the coated object. The paint was dispensed at the dispensing rate of 22.3 μl/s.

The substrate thus coated with the paint was baked first at the temperature of 90° C. for five minutes and then at the temperature of 230° C. for thirty minutes on the hot plate, whereupon the coating film was formed in uniform thickness and with high quality on the substrate.

Example 6

The coating film was formed using the coating apparatus having the two mouthpieces illustrated in FIG. 4.

The coated object used was the non-alkaline glass substrate coated with the photosensitive resin composition consisting of the acrylic polymer as in Example 5.

As in Example 5, the paint was charged into the paint tank and the paint was preliminarily filled inside the feed path up to the mouthpiece. Ethyl cellosolve as a treatment solution was also charged into the treatment tank and this solvent was preliminarily filled inside the feed path up to the mouthpiece.

The slit gap of the mouthpiece for supply of the paint was set to 40 μm, the clearance to 75 μm, the slit gap of the mouthpiece for supply of the treatment solution to 30 μm, and the clearance to 40 μm. The fixed displacement pump for delivery of the paint and the fixed displacement pump for delivery of the treatment solution both were high-precision diaphragm pumps, and the high-precision servo motor was adopted for the driving of the substrate carrying stage.

Each of the coating widths of the paint and the treatment solution was set to 355 mm, the substrate carrying speed to 20 mm/s, the dispensing rate of the paint to 49.5 μl/s, and the dispensing rate of the treatment solution to 20.0 μl/s. The mouthpiece for the treatment solution and the mouthpiece for the paint were positioned at the spacing of 100 mm and the dispensing operation was started from the position 2 mm apart from the front edge of the coated object and stopped at the position 3 mm apart from the rear edge of the coated object.

The substrate thus coated with the paint was baked first at the temperature of 90° C. for five minutes and then at the temperature of 230° C. for thirty minutes on the hot plate, whereupon the coating film was formed in uniform thickness and with high quality on the substrate.

Comparative Example 4

Figure 15:
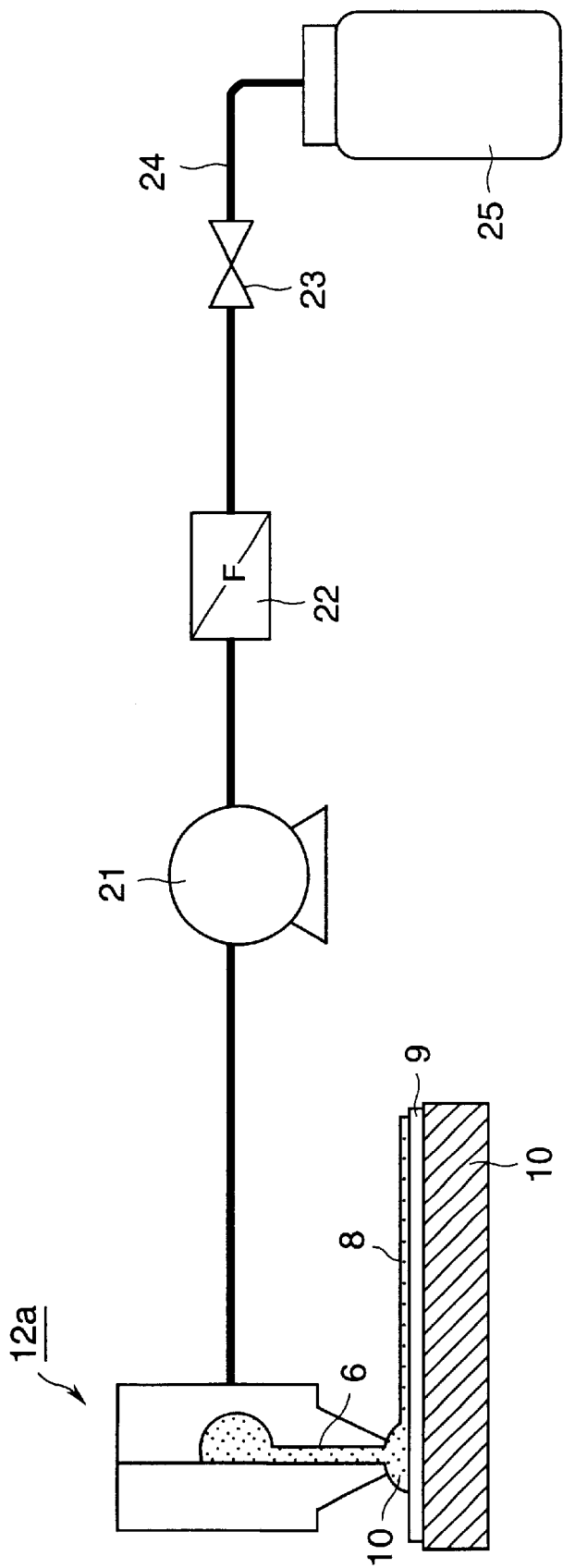
FIG. 15 is a schematic diagram to show the coating apparatus used in the comparative examples.

The coating of the paint was carried out in the same manner as in Example 5 except that the coating apparatus used was one provided with the mouthpiece having one slit as illustrated in FIG. 15 and the same paint as in Example 5 was charged in the tank 25.

Figure 16:
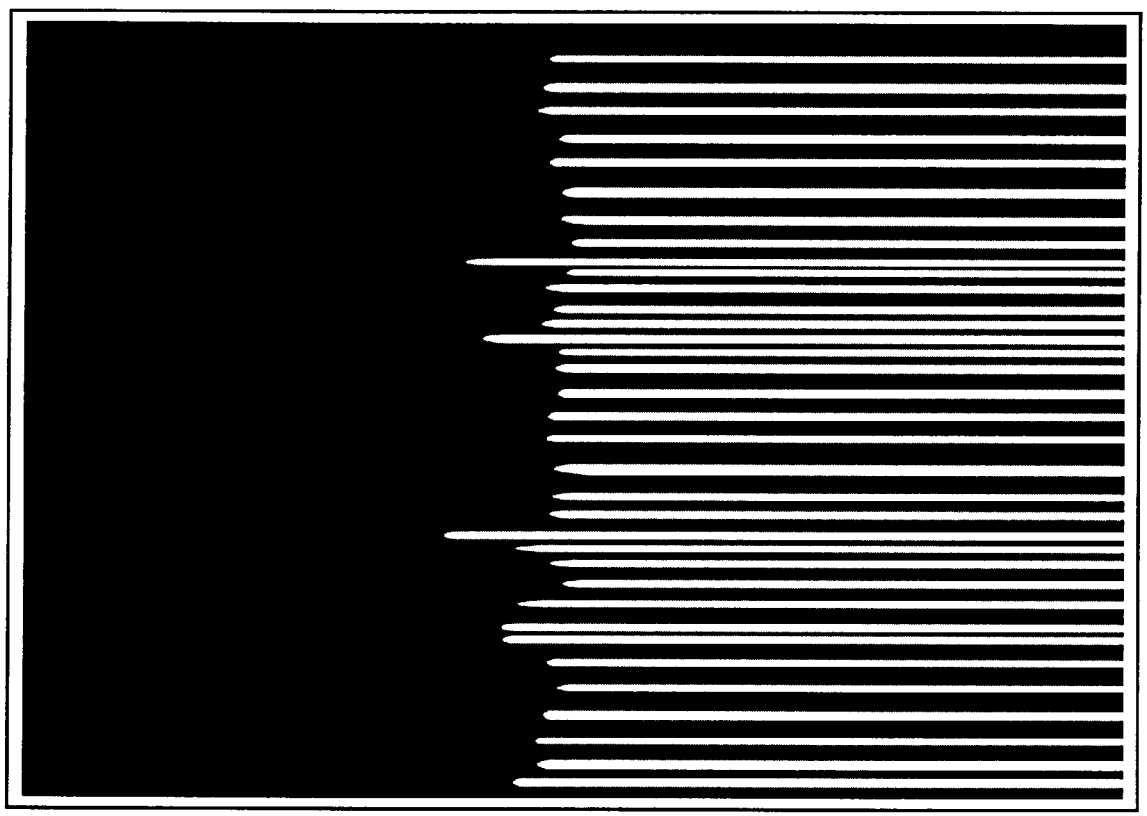
FIG. 16 is a diagram to show the coating film obtained in the comparative example.

As a result, the resultant coating film was the one of the stripe pattern as illustrated in FIG. 16.

What is claimed is:

1. A method of uniformly depositing a coating utilizing a mouthpiece moving relative to a coated object comprising the steps of:

starting the coating process and upon the start of the coating process, mixing a paint with a diluent to change the concentration of solid matter in said paint while dispensing the paint/diluent mixture on the coated substrate, and stopping the flow of said diluent once the coating process has reached a steady state and continuing said coating process with said paint and without said diluent.

2. The coating method of claim 1, wherein said diluent is a treatment solution, the treatment solution comprising a solvent component of said paint or a paint having a lower concentration of solid matter than said paint.

3. The method of claim 2, wherein said treatment solution is a treatment solution that decreases an angle of contact of the paint to a surface of said coated object.

4. A method of uniformly depositing a coating utilizing a mouthpiece moving relative to a coated object comprising the steps of:

dispensing a paint onto a coated object in a steady state coating process without mixing said paint with a diluent during said steady state coating process, and mixing said paint with a diluent to change the concentration of solid matter in said paint as the coating process ends and changes from a steady state coating process to an unsteady state coating process.

5. The coating method of claim 4, wherein said diluent is a treatment solution, the treatment solution comprising a solvent component of said paint or a paint having a lower concentration of solid matter than said paint.

6. The method of claim 5, wherein said treatment solution is a treatment solution that decreases an angle of contact of the paint to a surface of said coated object.

* * * * *